United States Patent
Huang

(10) Patent No.: US 6,235,593 B1
(45) Date of Patent: May 22, 2001

(54) SELF ALIGNED CONTACT USING SPACERS ON THE ILD LAYER SIDEWALLS

(75) Inventor: Jenn Ming Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/252,628

(22) Filed: Feb. 18, 1999

(51) Int. Cl.[7] .................................................. H01L 21/8242
(52) U.S. Cl. ......................... 438/279; 438/586; 438/595; 438/639; 438/702
(58) Field of Search ..................................... 438/199, 221, 438/586, 595, 597, 618, 639, 239, 279, 299, 696, 702

(56) References Cited

U.S. PATENT DOCUMENTS

| | | | |
|---|---|---|---|
| 5,268,330 | * 12/1993 | Givens et al. | 438/586 |
| 5,565,372 | 10/1996 | Kim | 437/52 |
| 5,648,291 | 7/1997 | Sung | 437/52 |
| 5,677,231 | * 10/1997 | Maniar et al. | 438/221 |
| 5,728,595 | * 3/1998 | Fukase | 438/241 |
| 5,731,236 | 3/1998 | Chou et al. | 438/253 |
| 5,766,992 | 6/1998 | Chou et al. | 438/241 |
| 5,792,703 | * 8/1998 | Bronner et al. | 438/620 |
| 5,807,779 | 9/1998 | Liaw | 438/279 |
| 5,981,369 | * 11/1999 | Yoshida et al. | 438/597 |
| 6,015,730 | * 1/2000 | Wang et al. | 438/241 |

OTHER PUBLICATIONS

Wolf et al., "Silicon Processing for the VLSI Era, vol. 1–Process Technology", Lattice Beach, 1986, pp. 384–385.*

* cited by examiner

Primary Examiner—Olik Chaudhuri
Assistant Examiner—Kurt Eaton
(74) Attorney, Agent, or Firm—George O. Saile; Stephen B. Ackerman; William J. Stoffel

(57) ABSTRACT

A method for a self-aligned contact (SAC) that forms top and bottom spacers on the sidewalls of the interlevel dielectric layer. Spaced gate structures are formed between said spaced isolation regions. The gate structure is comprised of a gate oxide layer; a conductive layer; a cap layer. Lightly doped drain regions (LDD) are formed. An interlevel dielectric (ILD) layer is formed. A contact hole is etched that exposes the LDD region between the gate structures and removes a portion of the cap layer. An interlevel dielectric spacer layer is formed over the interlevel dielectric layer, the sidewalls of the contact hole and on the LDD region. In a key step, the interlevel dielectric spacer layer is anisotropically etched forming a top spacer on the sidewalls of the upper opening and a bottom spacer on the lower opening. A contact plug is formed to fill the contact hole and electrically contacting the LDD region. The invention also forms borderless contact hole spacers. The invention's IDL spacers can be thinner than conventional spacers and allow better gap filling for the contact plug.

10 Claims, 5 Drawing Sheets

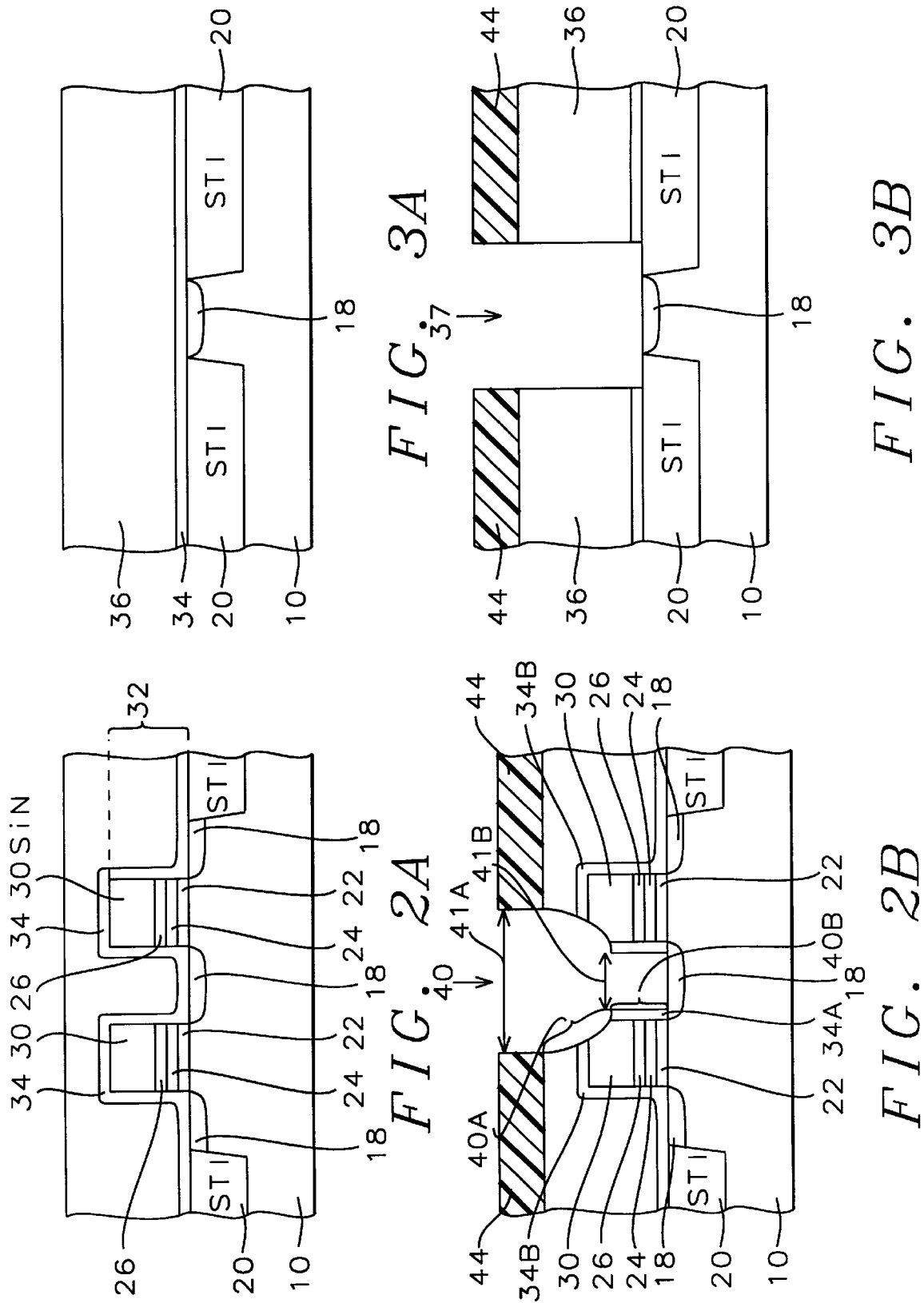

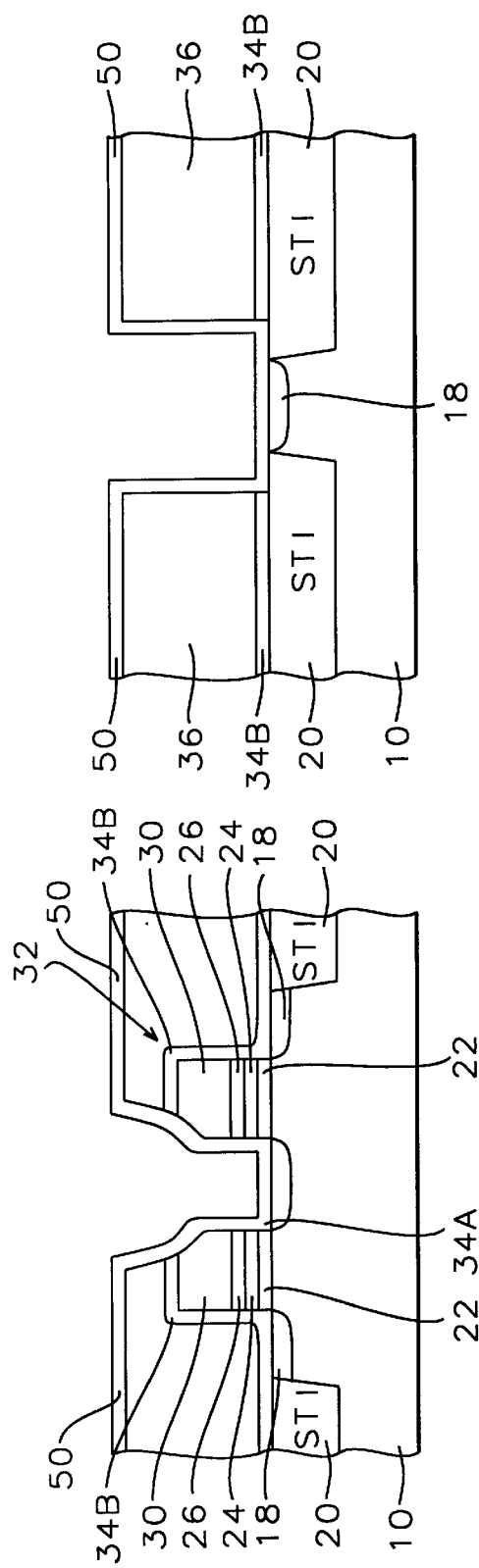
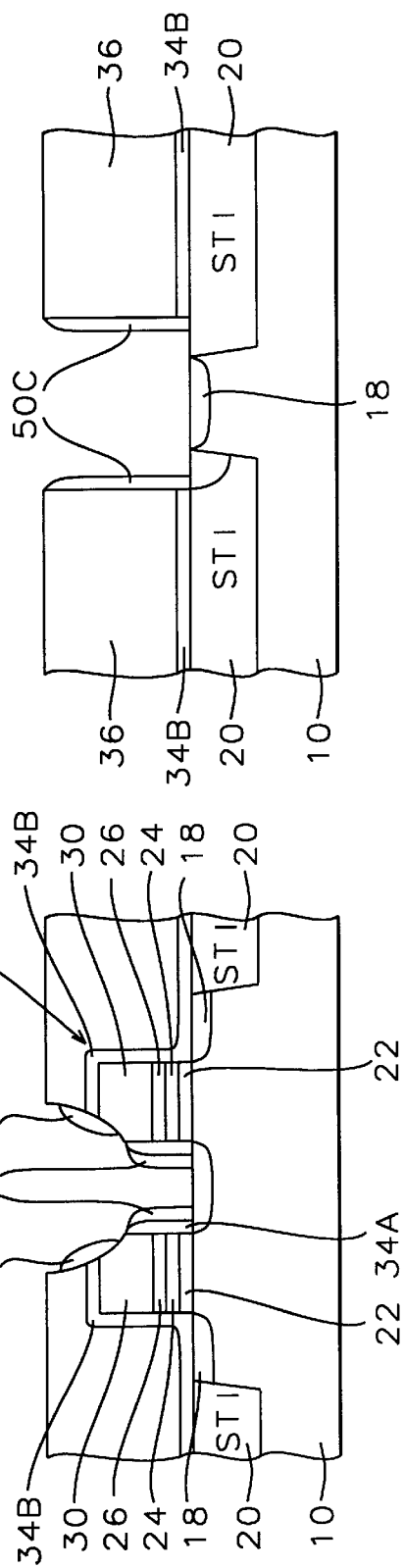
FIG. 2C
FIG. 2D
FIG. 3C
FIG. 3D

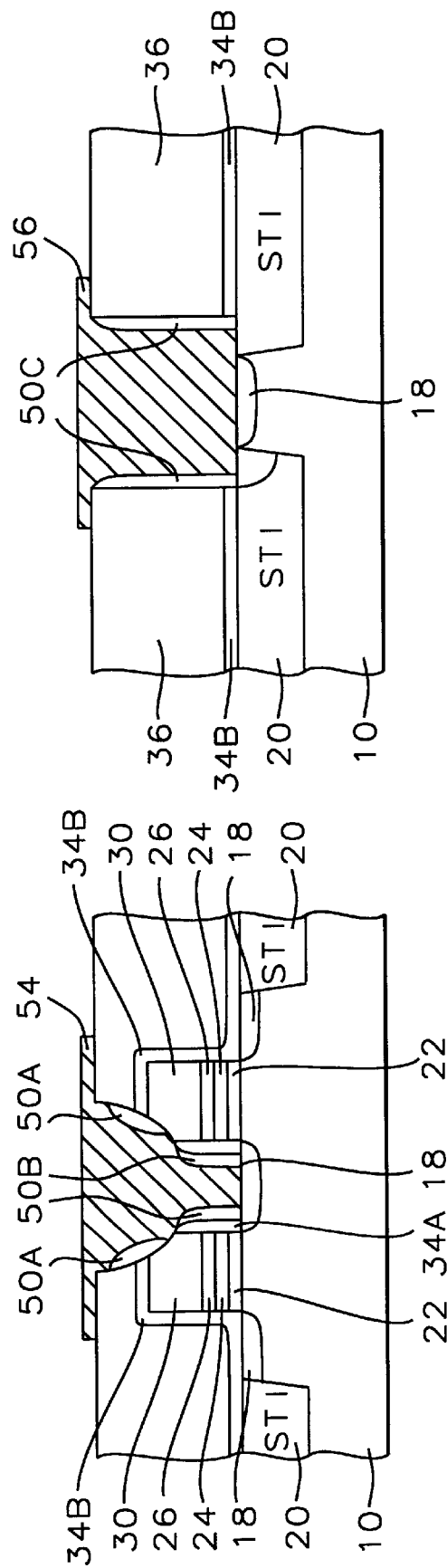

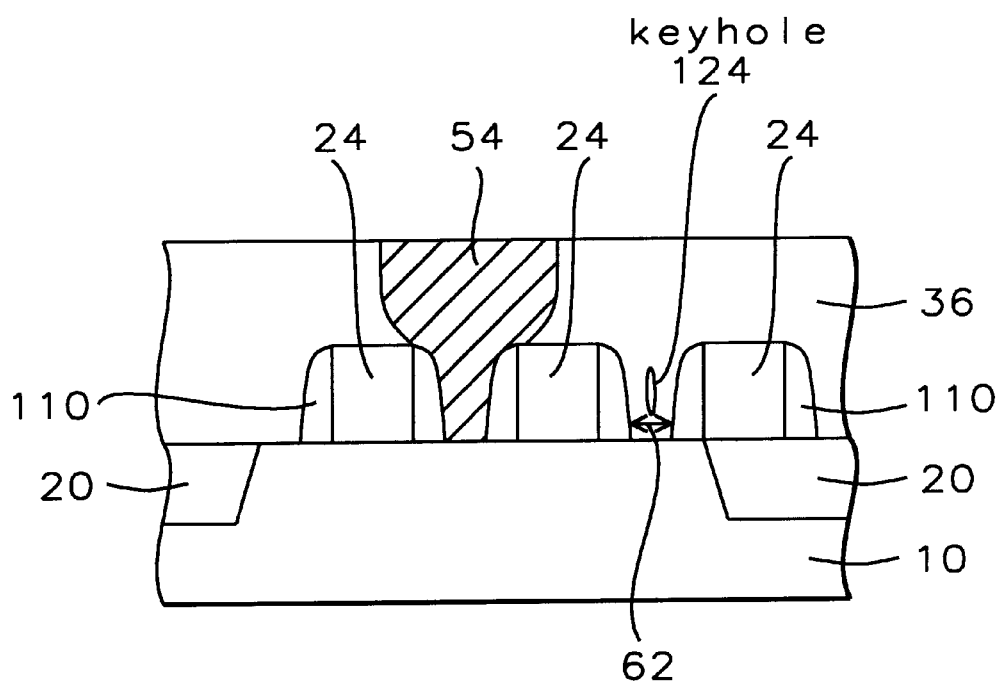
FIG. 4 – Prior Art

SELF ALIGNED CONTACT USING SPACERS ON THE ILD LAYER SIDEWALLS

BACKGROUND OF INVENTION

1) Field of the Invention

The present invention relates to the fabrication of semiconductor devices, and more specifically to a fabrication sequence used to from a self aligned contact (SAC) to a substrate for a metal oxide semiconductor field effect (MOSFET).

2) Description of the Prior Art

The semiconductor industry is continually striving to improve the performance of semiconductor devices, while still attempting to reduce the cost of these same devices. These objectives have been successfully addressed by the ability of the semiconductor industry to practice micro-miniaturization, or to fabricate semiconductor devices with sub-micron features. Several fabrication disciplines, such as photolithography, as well as dry etching, have allowed micro-miniaturization to be realized. The use of more sophisticated exposure cameras, as well as the use of more sensitive photoresist films, have allowed the attainment of sub-micron images in photoresist films, to be routine achieved. In addition the development of more advanced dry etching tools and processes, have allowed the sub-micron images, in masking photoresist films, to be successfully transferred to underlying materials used for the fabrication of semiconductor devices.

In addition to advances in semiconductor fabrication disciplines, several device structural innovations have also contributed to the quest for higher performing, lower cost, semiconductor devices. For example, the use of a self-aligned contact (SAC), procedure allows the amount of source and drain contact area to be reduced, thus allowing smaller devices to be constructed, resulting in faster, as well as lower cost devices, to be realized. The SAC procedure, using a sub-micron ground rule, opens a sub-micron region in an insulator layer, exposing an underlying source and drain region. However only a portion of the sub-micron SAC opening is used to expose the underlying source and drain region, with the remainder of the sub-micron SAC opening overlapping an adjacent polysilicon gate structure. Therefore the source and drain contact region is smaller then the SAC opening. If the contact opening to the source and drain was to made entirely overlaying the source and drain region, the source and drain region would have to be designed larger, to accommodate the fully landed contact hole opening, thus resulting in a undesirable, larger semiconductor device. In addition to the cost and performance benefits of devices fabricated using the SAC procedure, a dielectric sidewall spacer can also be used, allowing the SAC opening to be created, exposing the insulator sidewall of a polysilicon gate structure.

As shown in FIG. 4, a problem the inventor has found is that keyholes 124 are formed in ILD layers 36 when the spacing 62 between conventional spacers 110 is small. FIG. 4 shows gates 24, which can comprise several layers, with conventional spacers 110 formed on the sidewalls. Conventional spacers 110 have a width between 800 and 2000 Å. A substrate 10 has STI regions 20 formed therein. A self aligned contact (SAC) plug 54 is formed to contact the substrate. The poly lines 24 are spaced closer in areas away from the SAC plug 54.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,648,291 (Sung) shows a spacer formed on the sidewalls of contact.

U.S. Pat. No. 5,565,372 (Kim) shows a contact having a spacer.

U.S. Pat. No. 5,766,992 (Chou et al.) shows a contact process with extra SiN spacers over the gate.

U.S. Pat. No. 5,731,236 (Chou et al.) and U.S. Pat. No. 5,807,779 (Liaw) show other self aligned contact (SAC) processes.

SUMMARY OF THE INVENTION

It is an object of this invention to use thin interlevel dielectric spacers, on the sides of interlevel dielectric layer and a polysilicon gate structure, of a MOSFET device, to improve the insulator integrity in the sub-micron diameter self aligned contact (SAC) opening.

It is yet another object of this invention to create a self aligned contact (SAC) structure to a source or drain region of a MOSFET device, featuring a sub-micron diameter, self aligned contact (SAC) opening in a thick interlevel insulator layer, with the sub-micron diameter, SAC opening.

It is another object of the invention to form IDL spacers on a self aligned contact (SAC) between gate structures and simultaneously form IDL spacers on a contact without gate structures.

To accomplish the above objectives, the present invention provides a method of manufacturing a self-aligned contact (SAC) that forms spacers on the sidewalls of the interlevel dielectric layer. This contrasts with the prior art that only forms spacers on the sidewalls of the gate structure, not on the sidewalls of the interlevel dielectric layer. The invention also simultaneously forms a borderless contact with spacers. The method includes the following steps.

A gate dielectric layer is formed on the substrate. A conductive layer is formed over the gate oxide layer. The conductive layer is preferably comprised of a polysilicon layer and an overlying polycide layer. A cap layer is formed over the conductive layer. The cap layer and the conductive layer are patterned to form spaced gate structures on the substrate. The spaced gate structures are spaced apart between about 0.15 and 0.35 μm. Next, ions are implanted ions into the substrate adjacent to the gate structures to form LDD regions in the substrate. An optional liner layer is preferably composed of Silicon oxynitride, $SiO_2$ or silicon nitride, can be deposited over the substrate and the gate structures. An interlevel dielectric layer is deposited over the substrate and gate structures.

The interlevel dielectric layer and the liner layer and the cap layer are etched to form a contact hole that exposes the LDD region between the gate structures and removes a portion of the cap layer. The contact hole has sidewalls of the interlevel dielectric (ILD) layer. An interlevel dielectric spacer layer is formed over the interlevel dielectric layer. The sidewalls of the contact hole and on the LDD region.

In a key step, the interlevel dielectric spacer layer is anisotropically etched forming a top spacer on the sidewalls of the upper opening and a bottom spacer on the lower opening. The top and bottom spacers are not connected and are two separate distinct spacers. A contact plug is formed to fill the contact hole and electrically contacting the LDD region.

The invention's method of fabrication of a self aligned contact (SAC) uses thin interlevel dielectric spacers. The present invention provides a method of manufacturing a self-aligned contact (SAC) that forms top spacers on the sidewalls of the interlevel dielectric layer, and bottom spacers on the sidewalls of the gate structure. The invention provides a preferred embodiment for forming a borderless contact with sidewall spacers.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A, 2B, 2C, 2D and 2E are cross sectional views taken along axis 2/2' in FIG. 1 showing the method of the present invention for form a self aligned contact (SAC).

FIGS. 3A, 3B, 3C, 3D and 3E are cross sectional views taken along axis 3/3' in FIG. 1 showing the method of the present invention for form a borderless contact.

FIG. 4 is a cross sectional view of a SAC contact with conventional thick spacers 110 and a key hole problem 124 according to the prior art.

DETAILED DESCRIPTION OF THE PREFERRED EMBODIMENTS

Figure 1:
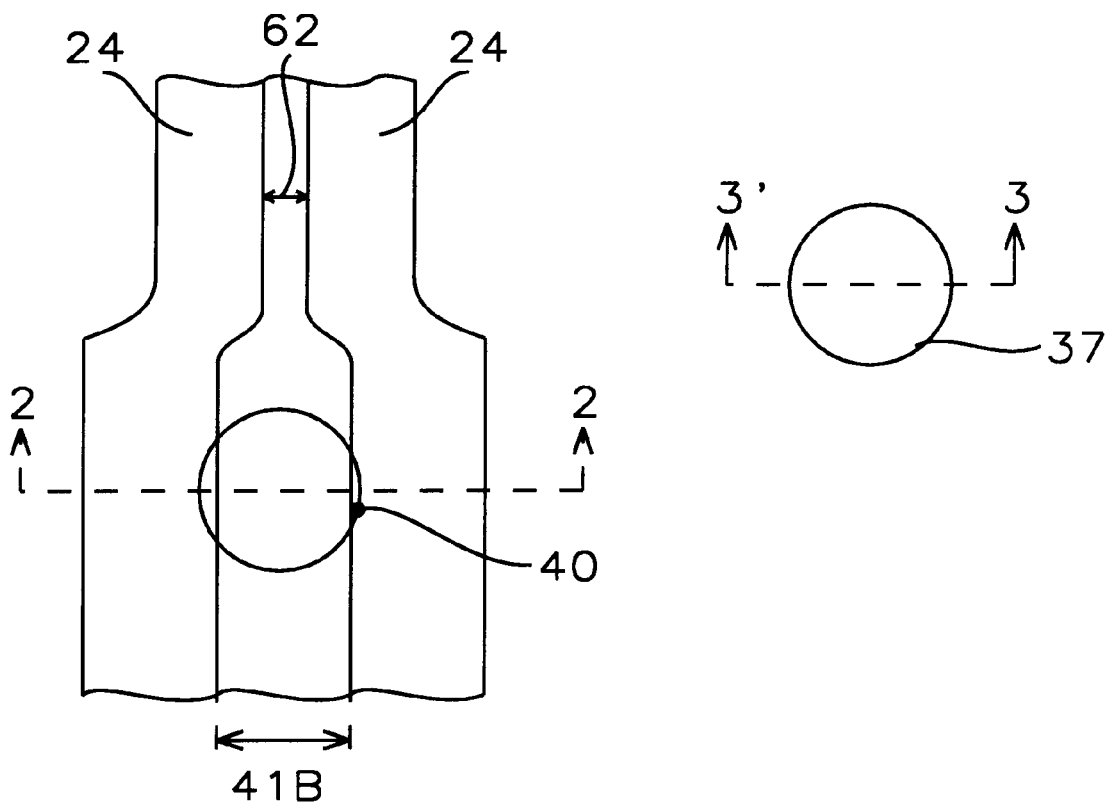
FIG. 1 is a top down view of the self aligned contact (SAC) and borderless contact of the present invention.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Overview Of Preferred Embodiments of the Invention

The present invention provides a preferred embodiment of a method of manufacturing a self-aligned contact (SAC) that forms spacers 50A 50B on the sidewalls of the interlevel dielectric layer. This contrasts with the prior art that forms spacers on the sidewalls of the gate structure, not on the sidewalls of the interlevel dielectric layer. The invention also simultaneously forms a borderless contact 64 with spacers (borderless contact spacers) 50C. The method includes the following steps.

1. A gate dielectric layer 22 is formed on the substrate 10.
2. A conductive layer 24 26 is formed over the gate oxide layer. The conductive layer 24 26 is preferably comprised of a polysilicon layer 24 and an overlying polycide layer 26.
3. A cap layer 30 is formed over the conductive layer 24 26.
4. The cap layer 30 and the conductive layer 24 26 are patterned to form spaced gate structures 32 on the substrate 10. The spaced gate structures are spaced 41B apart between about 0.15 and 0.35 μm.
5. Next, ions are implanted ions into the substrate adjacent to the gate structures to form LDD regions 18 in the substrate 10.
6. An optional liner layer 34 is preferably composed of Silicon oxynitride, $SiO_2$ or silicon nitride, can be deposited over the substrate and the gate structures 32.
7. An interlevel dielectric layer 36 is deposited over the substrate and gate structures.
8. The interlevel dielectric layer and the liner layer and the cap layer are etched to form a contact hole 40 that exposes the LDD region between the gate structures and removes a portion of the cap layer. The contact hole has sidewalls of the interlevel dielectric (ILD) layer.
9. An interlevel dielectric spacer layer 50 is formed over the interlevel dielectric layer. The sidewalls of the contact hole 40 and on the LDD region 18.
10. In a key step, the interlevel dielectric spacer layer 50 is anisotropically etched forming top spacers (upper spacers) 50A on the sidewalls of the upper opening 40A and bottom spacers (lower spacers)50B on the lower opening 40B. The top and bottom spacers 50A SOB are not connected and are two separate distinct spacers. Refer to FIG. 2D and 3D.
11. A contact plug is formed to fill the contact hole and electrically contacting the LDD region 18.

The invention's method of fabrication of a self aligned contact (SAC) uses thin interlevel dielectric spacers 50A SOB. As shown in FIG. 2D, the present invention provides a method of manufacturing a self-aligned contact (SAC) that forms a top spacers 50A on the sidewalls 40A of the interlevel dielectric layer 36, and bottom spacers 50B on the sidewalls 40B of the gate structure 32. This contrasts with the prior art that forms gate spacers on the sidewalls of the gate structure (before the IDL layer is formed). That is, the prior art differs from the invention in the:

(1) number of spacers formed (1 conventional vs 2 Invention), (2) the location of the spacers, and (3) the order the spacers are formed (the Prior art forms gate spacers 110 (FIG. 4) before the ILD layer is deposited whereas the invention forms spacers (50A 50B) after the ILD layer 36 is deposited).

The invention's self aligned contact (SAC) provides the following advantages over the prior art.

(1) allows SAC contact plug formed between more closely spaced gates because the spacers 50A 50B are thinner than conventional spacers. The invention's spacers have a width between about 100 and 500 Å that contrasts with conventional spacer 120 (see FIG. 4) width of between about 800 and 2000 Å. The invention allows the use of thinner bottom spacers 50B because the spacers 50B do not have to have extra thickness to compensate for the spacer loss during SAC etch. (See FIG. 2B for SAC etch step)

(2) self aligned contact (SAC) is independent of a gate spacer.

(3) Compatible with borderless contacts. (does not need gate structure to form contact)

(4) Easy SAC contact etching because don't consider spacer loss.

(5) Easy gap filling and planarization between small spacing of poly.

The present invention achieves these benefits in the context of known process technology. However, a further understanding of the nature and advantages of the present invention may be realized by reference to the latter portions of the specification and attached drawings.

Self Aligned Contact (SAC) and Borderless Contact

FIG. 1 shows a top down view of the invention's self aligned contact (SAC) and borderless contact. Both the SAC and borderless contacts steps are performed simultaneously. See FIGS. 2A to 3E). FIG. 1 also shows a borderless contact opening 37 (axis 3/3'). FIG. 1 shows a SAC opening 40 it is harder to fill between the gates with ILD layer. For example, FIG. 1 shows that tight space 62 is between about 0.15 and 0.2 $\mu$m and the distance 41B between the gates 24 in the SAC area is between 0.15 and 0.25 $\mu$m. Because the invention's Bottom spacers 50B are thinner than conventional gate sidewall spacers, it is easier to gap fill between tightly spaced gates.

FIGS. 2A, 2B, 2C, 2D and 2E are cross sectional view taken along axis 2/2' in FIG. 1.

FIGS. 3A, 3B, 3C, 3D and 3E are cross sectional view taken along axis 3/3' in FIG. 1 showing a borderless contact.

The process step shown in FIGS. 2A/3A are preformed simultaneously. Likewise with FIGS. 2B/3B, 2C/3C, 2D/2E. That is the SAC and borderless contact are performed in the same contact steps.

FIGS. 2A & 3A show the step of forming spaced isolation regions 20 in a substrate 10. FIGS. 2A to 2D show the SAC area and FIG. 3A to 3D show the borderless contact area of the substrate. The isolation regions 20 can be formed using any isolation process, such as LOCOS or shallow trench isolation (STI) processes.

A gate dielectric layer 22 is formed on the substrate 10. The gate dielectric layer is preferably composed of silicon oxide or Silicon oxynitride and preferably has a thickness of between about 50 and 150 Å.

A conductive layer 24 26 is formed over the gate oxide layer. The conductive layer 24 26 is preferably comprises of a polysilicon layer 24 and an overlying polycide layer 26. The polysilicon layer 24 can have a thickness of between about 1000 and 1500 Å.

The polycide layer can be composed of $WSi_x$ with a thickness of between about 500 and 2000 Å. The polycide layer can also be formed of W with a thickness of between about 1000 and 2000 Å. Third, the polycide layer can be formed of a two layer sandwich of a polysilicon layer with a thickness of between 200 and 500 Å and a tungsten (W) layer with a thickness of between about 1000 and 2000 Å.

A cap layer 30 is formed over the conductive layer 24 26. The cap layer 30 is preferably composed of silicon nitride, Silicon oxynitride (SiON), a two layer structure of $SiO_2$ and $Si_3N_4$ or $SiO_2$ and Silicon oxynitride; and is most preferably composed of silicon nitride. The cap layer preferably has a thickness of between about 1000 and 3000 Å.

The cap layer 30, the conductive layer 24 26 and the gate dielectric layer 22 are patterned to form spaced gate structures 32 on the substrate 10. The spaced gate structures are spaced 41B between about 0.15 and 0.35 $\mu$m apart.

Next, ions are implanted ions into the substrate adjacent to the gate structures to form lightly doped drain/source regions or source/drain regions 18 in the substrate 10. The source/drain regions have standard doping levels, while the lightly doped drains have a lower doping concentration.

An optional liner layer 34 composed of Silicon oxynitride, $SiO_2$ or silicon nitride, is deposited over the substrate and the gate structures 32. The liner layer preferably has a thickness of between about 20 and 200 Å. The liner layer has an advantage of being an etch stop layer during self aligned contact (SAC) etch to achieve well self-aligned to the polysilicon layer 24 and the borderless contact to the active region.

An interlevel dielectric layer 36 is deposited over the substrate and gate structures. The interlevel dielectric (IDL) layer 36 is preferably composed of $SiO_2$ (silicon dioxide) and preferably has a thickness of between about 3000 and 8000 Å.

As shown in FIGS. 2B and 3B, the interlevel dielectric layer, the liner layer (if present) and the cap layer are etched to form a contact hole 40 that exposes the LDD regions 18 between the gate structures 32 and removes a portion of the cap layer 30. The etch also forms a borderless contact hole 37. The thickness of the cap layer that is removed is between about 500 and 1000 Å.

The etch is preferably a RIE etch using reactants F based chemistry. Since the etch many not have perfect selectivity, a portion of the cap layer 30 is removed. The etch preferably has a $SiO_2$ to SiN selectivity of between 5 and 15.

The contact hole has sidewalls of the interlevel dielectric (ILD) layer. The contact hole exposes the liner layer and/or the sidewalls of the gate structure 32 if the liner layer is not present.

The contact hole 40 has an upper opening 40A above the top of the conductive layer 24 26, and a lower opening 40B below the bottom of the capping layer.

The upper opening has a top diameter 41A at the top surface of the interlevel dielectric layer 36 between about 0.3 and 0.4 $\mu$m, and the lower opening have a bottom diameter 41B at the substrate surface between about 0.15 and 0.35 $\mu$m.

The etch leaves remaining portions of the liner layer 34A 34B. The remaining portion of the liner layer 34 on the sidewalls of said gate structure 22 24 26 is a first liner spacer 34A.

Referring to FIGS. 2C and 3C, a spacer layer 50 is formed over the interlevel dielectric layer, the sidewalls of the contact hole 40 and on the LDD region 18 and in the borderless contact hole 37. The IDL spacer layer 50 preferably has a thickness of between about 50 and 500 Å, and is composed of $SiO_2$, SiN or Silicon oxynitride (SiON) and is most preferably composed of $SiO_2$.

Key step—Etching the spacer layer 50 to form top spacers 50A, bottom spacers 50B and borderless contact spacers 50C.

In a key step shown in FIGS. 2D and 3D, the interlevel dielectric spacer layer 50 is anisotropically etched forming a top spacer 50A on the sidewalls of the upper opening 40A and a bottom spacer S0B on the lower opening 40B. FIG. 3C taken along axis 3/3' in FIG. 1 shows that the spacer 5C is formed on the interlevel dielectric sidewalls where the gates are not present.

The top spacer 50A preferably has a height in a range of between about 200 and 1000 Å and a width between about 50 and 500 Å.

The lower spacer 50B preferably has a height in a range of between about 2000 and 3000 Å and a width between about 50 and 5000 Å.

The interlevel dielectric (IDL) spacer 50C (borderless contact spacer) preferably has a height in a range of between about 3000 and 8000 and a width between about 50 and 500 Å.

At this point in the process, Source and drain regions can be formed in the substrate using an ion implant (I/I). There are 3 step where S/D regions can be formed (1) after the cap layer 30, the conductive layer 24 26 and the gate dielectric layer 22 are patterned to form spaced gate structures 32 on the substrate 10; (2) after the liner deposition and (3) after the upper and bottom spacer 50A 50B formation.

Referring to FIGS. 2E and 3E, a contact plug 54 is formed to fill the contact hole and electrically contacting the LDD region 18. The contact plug is preferably composed of W, or polysilicon and is most preferably composed of polysilicon. An borderless contact plug 56 is also formed as shown in FIG. 3E.

Benefits of the Invention

The invention's self aligned contact (SAC) provides the following advantages over the prior art.

(1) allows a SAC contact plug formed between more closely spaced gates because the spacers 50A 50B are thinner than conventional spacers. The invention's spacers have a width between about 100 and 500 Å that contrasts with conventional spacer 120 (see FIG. 4) width of between about 400 and 2000 Å. The invention's spacers 50A 50B allow better gap filling because the spacer 50A is only formed on the sidewall of the SAC hole. Thus the smallest spacing 62 of the polysilicon 24 (poly 1) would not be consumed by the spacer. See FIG. 1.

The invention's bottom spacer 50B is thinner than conventional gate spacers. The SAC etch consumes some of the conventional gate spacers so the convention spacers have to be thicker.

(2) self aligned contact (SAC) is independent of a gate spacer.

(3) Compatible with borderless contacts (does not need gate structures to form contacts).

The present invention achieves these benefits in the context of known process technology. However, a further understanding of the nature and advantages of the present invention may be realized by reference to the latter portions of the specification and attached drawings.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a self aligned contact (SAC) using thin interlevel dielectric spacers comprising the steps of:
   a) forming spaced isolation regions in a substrate; said substrate having a self aligned contact area and a borderless contact area;
   b) forming a gate dielectric layer on said substrate;
   c) forming a conductive layer over said gate dielectric layer;
   d) forming a cap layer over said conductive layer; said cap layer having a bottom;
   e) patterning said cap layer, said conductive layer and said gate dielectric layer to form spaced gate structures on said substrate; implanting ions into said substrate adjacent to said gate structures to form LDD regions in said substrate; depositing a liner layer over said substrate and said gate structure;
   f) forming an interlevel dielectric layer over said substrate and gate structures;
   g) etching said interlevel dielectric layer and said cap layer forming a contact hole that exposes said LDD region between said gate structures; and that removes a section of said liner layer on said cap layer leaving remaining portions of said liner layer, and removes a portion of said cap layer; said contact hole having sidewalls of said interlevel dielectric layer; said contact hole have an upper opening above the top of said conductive layer; and a lower opening below the bottom of said cap layer; the remaining portion of said liner layer on the sidewalls of said gate structure is a first liner spacer;
   h) forming an interlevel dielectric spacer layer over said interlevel dielectric layer, the sidewalls of said contact hole and on said LDD region;
   i) anisotropically etching said interlevel dielectric spacer layer forming a top spacer on the sidewalls of said upper opening and a bottom spacer on said lower opening; said bottom spacer is on said first liner spacer; and
   j) forming a contact plug filling said contact hole and electrically contacting said LDD region.

2. The method of claim 1 wherein said conductive layer comprised of a polysilicon layer and an overlying polycide layer.

3. The method of claim 1 wherein said interlevel dielectric spacer layer has a thickness of between about 100 and 500 Å; and is composed of silicon oxide, silicon nitride or Silicon oxynitride.

4. The method of claim 1 wherein said top spacer has a height in a range of between about 200 and 1000 Å and a width of between about 50 and 500 Å and said bottom spacer has a height in range of between about 2000 and 3000 Å and a width of between about 50 and 500 Å; and said spaced gate structures are spaced between about 0.15 and 0.35 µm apart.

5. The method of claim 1 which further includes forming borderless contact spacer on the sidewalls of a borderless contact hole.

6. The method of claim 1 wherein said upper opening having a top diameter at the top surface of said interlevel dielectric layer between about 0.3 and 0.4 µm; and said lower opening has a bottom diameter at the substrate surface between about 0.15 and 0.35 µm.

7. A method of fabrication of a self aligned contact using thin top and bottom spacers comprising the steps of:
   a) forming spaced isolation regions in a substrate; said substrate having a self aligned contact (SAC) area;
   b) forming a gate dielectric layer on said substrate;
   c) forming a conductive layer over said gate dielectric layer;
   d) forming a cap layer over said conductive layer; said cap layer having a bottom;
   e) patterning said cap layer, said conductive layer and said gate dielectric layer to form spaced gate structures on said substrate; said spaced gate structures are spaced between about 0.15 and 0.75 µm apart;
   f) implanting ions into said substrate adjacent to said gate structures to form LDD regions in said substrate;
   g) depositing a liner layer composed of Silicon oxynitride, $SiO_2$ or silicon nitride, over said substrate and said gate structures;
   h) forming an interlevel dielectric layer over said substrate and gate structures;

i) etching said interlevel dielectric layer and said liner layer and said cap layer forming a contact hole that exposes said LDD region between said gate structures, and leaves remaining portions of said liner layer; the remaining portion of said liner layer on the sidewalls of said gate structure is a first liner spacer; and removes a portion of said cap layer; said contact hole having sidewalls of said interlevel dielectric (ILD) layer; said contact hole have a upper opening above the top of said conductive layer; and a lower opening below the bottom of said cap layer; the etch leaving remaining portions of said liner layer;

j) forming an interlevel dielectric spacer layer over said interlevel dielectric layer; the sidewalls of said contact hole and on said LDD region;
   (1) said interlevel dielectric spacer layer has a thickness of between about 100 and 500 Å; and is composed of silicon oxide, silicon nitride or Silicon oxynitride (SiON);

k) anisotropically etching said interlevel dielectric spacer layer forming a top spacer on the sidewalls of said upper opening and a bottom spacer on said lower opening; said bottom spacers formed on the sidewalls of said first liner spacer;

l) forming a contact plug filling said contact hole and electrically contacting said LDD region.

8. The method of claim 7 wherein said upper opening having a top diameter at the top surface of said interlevel dielectric layer between about 0.3 and 0.4 μm; and said lower opening have a bottom diameter at the substrate surface between about 0.15 and 0.35 μm.

9. The method of claim 7 wherein said top spacer has a height in a range of between about 200 and 1000 Å and a width of between about 50 and 500 Å; and said bottom spacer has a height in a range of between about 2000 and 3000 Å and a width of between about 50 and 500 Å.

10. A method of fabrication of a self aligned contact using thin top and bottom spacers and forming a borderless contact with borderless contact spacers comprising the steps of:
   a) forming spaced isolation regions in a substrate; said substrate having a self aligned contact (SAC) area and a borderless contact area;
   b) forming a gate dielectric layer on said substrate;
   c) forming a conductive layer over said gate dielectric layer;
   d) forming a cap layer over said conductive layer; said cap layer having a bottom;
   e) patterning said cap layer, said conductive layer and said gate dielectric layer to form spaced gate structures on said self aligned contact area; said spaced gate structures are spaced between about 0.15 and 0.35 μm apart;
   f) implanting ions into said substrate adjacent to said gate structures to form LDD regions in said substrate;
   g) depositing a liner layer composed of silicon nitride, over said substrate and said gate structures;
   h) forming an interlevel dielectric layer over said substrate and gate structures; said interlevel dielectric layer is comprised of silicon oxide;
   i) etching said interlevel dielectric layer and said liner layer, a section of said liner layer on said cap layer; and said cap layer forming a contact hole in said self aligned contact area and a borderless contact hole in said borderless contact area; said contact hole exposes said LDD region between said gate structures and removes a portion of said cap layer; said contact hole and said borderless contact hole defined by sidewalls of said interlevel dielectric layer; the etch is performed using a RIE etch with a F based chemistry with a $SiO_2$ to silicon nitride selectivity between 5 and 15;
      (1) said contact hole have a upper opening above the top of said conductive layer, and a lower opening below the bottom of said cap layer;
      (2) said upper opening having a top diameter at the top surface of said interlevel dielectric layer between about 0.3 and 0.4 μm; and said lower opening have a bottom diameter at the substrate surface between about 0.15 and 0.35 μm;
      (3) the etch leaving remaining portions of said liner layer; the remaining portion of liner layer on the sidewalls of said gate structure is a first liner spacer;
   j) forming an interlevel dielectric spacer layer over said interlevel dielectric layer; the sidewalls of said borderless contact hole, said contact hole and on said LDD region; said interlevel dielectric spacer layer has a thickness of between about 100 and 500 Å; and said interlevel dielectric spacer layer is composed of $SiO_2$, silicon nitride or Silicon oxynitride;
   k) anisotropically etching said interlevel dielectric spacer layer forming (1) borderless contact spacer on said sidewalls of said borderless contact hole, (2) top spacers on the sidewalls of said upper opening and (3) bottom spacers on said lower opening; said bottom spacers formed on the sidewalls of said first liner spacer: said top spacer has a height in a range of between about 200 and 1000 Å and a width of between about 50 and 500 Å; and said bottom spacer has a height in a range of between about 2000 and 3000 Å and a width of between about 50 and 500 Å;
   l) forming a contact plug filling said contact hole and electrically contacting said LDD region and filling said borderless contact hole.

* * * * *